(12) United States Patent　　(10) Patent No.: US 9,275,881 B2
Nagamine et al.　　(45) Date of Patent: Mar. 1, 2016

(54) LIQUID PROCESSING APPARATUS, LIQUID PROCESSING METHOD, AND STORAGE MEDIUM

(71) Applicant: Tokyo Electron Limited, Tokyo (JP)

(72) Inventors: Shuichi Nagamine, Kumamoto (JP); Yusuke Hashimoto, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 736 days.

(21) Appl. No.: 13/659,996

(22) Filed: Oct. 25, 2012

(65) Prior Publication Data

US 2013/0104940 A1　　May 2, 2013

(30) Foreign Application Priority Data

Oct. 27, 2011　(JP) ................................. 2011-236354

(51) Int. Cl.
  *B08B 11/00* (2006.01)
  *H01L 21/67* (2006.01)
  *H01L 21/02* (2006.01)
(52) U.S. Cl.
  CPC ...... *H01L 21/67051* (2013.01); *H01L 21/6715* (2013.01); *H01L 21/02057* (2013.01)
(58) Field of Classification Search
  None
  See application file for complete search history.

(56) References Cited

U.S. PATENT DOCUMENTS

| | | | | |
|---|---|---|---|---|
| 5,209,180 | A * | 5/1993 | Shoda | B05C 11/08 118/302 |
| 2003/0196683 | A1* | 10/2003 | Izumi | B08B 3/08 134/2 |
| 2008/0078426 | A1* | 4/2008 | Miya | H01L 21/67028 134/30 |
| 2009/0014033 | A1* | 1/2009 | Tokuno | H01L 21/02052 134/18 |

FOREIGN PATENT DOCUMENTS

| | | |
|---|---|---|
| JP | 11-145099 A | 5/1999 |
| JP | 1999-176795 A | 7/1999 |
| JP | 2009-135396 A | 6/2009 |

* cited by examiner

*Primary Examiner* — Michael Kornakov
*Assistant Examiner* — Ryan Coleman
(74) *Attorney, Agent, or Firm* — Abelman, Frayne & Schwab

(57) ABSTRACT

A liquid processing apparatus of the present disclosure includes a rotatable substrate holder that holds a wafer from above, and a top plate nozzle that supplies at least rinse liquid to the wafer and is provided in the rotation center of the substrate holder. The top plate nozzle is movably configured with the substrate holder in the top-bottom direction, and the rinse liquid is supplied to the wafer from the top plate nozzle while the top plate nozzle is spaced from the substrate holder. When the top plate nozzle approaches to the substrate holder, the rinse liquid is supplied to the lower surface of the substrate holder from the top plate nozzle to clean the lower surface of the substrate holder.

7 Claims, 12 Drawing Sheets

FIG.10.A
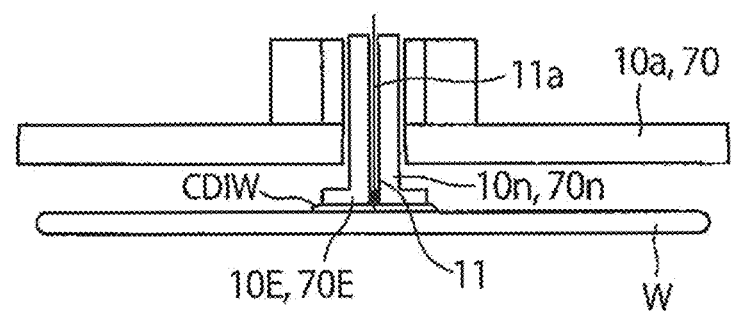
FIG.10B
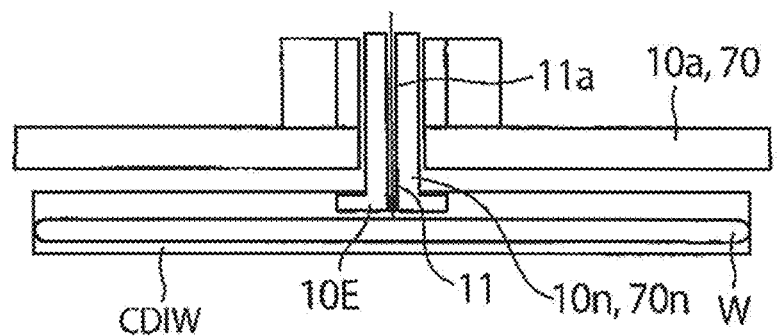

LIQUID PROCESSING APPARATUS, LIQUID PROCESSING METHOD, AND STORAGE MEDIUM

CROSS-REFERENCE TO RELATED APPLICATIONS

This application is based on and claims priority from Japanese Patent Application No. 2011-236354, filed on Oct. 27, 2011, with the Japanese Patent Office, the disclosure of which is incorporated herein in its entirety by reference.

TECHNICAL FIELD

The present disclosure relates to a liquid processing apparatus, a liquid processing method, and a storage medium that perform a predetermined liquid processing such as, for example, a cleaning processing and an etching processing for a substrate such as, for example, a semiconductor wafer, by supplying a processing liquid to the substrate while rotating the substrate in a state where the substrate is maintained in the horizontal direction.

BACKGROUND

In a process that manufactures semiconductor wafers or glass substrates for flat panel displays, a liquid processing is performed for the substrates as a substrate processing.

The substrate is held by a substrate holder, the substrate is rotated while the substrate is covered with a substrate, and a cover plate may be provided to prevent the scattering of the mist of the processing liquid dropped from the substrate. See, for example, Japanese Patent Application Laid-Open No. 11-176795.

SUMMARY

The present disclosure provides a liquid processing apparatus comprising: a cover plate that covers a substrate from above; a cover plate rotating mechanism that rotates the cover plate; a nozzle including a first discharging port provided in the rotational center of the cover plate and configured to supply a rinse liquid toward the substrate, and a second discharging port configured to supply the rinse liquid toward the cover plate; and a nozzle driving unit configured to move the nozzle into an ascending position or a descending position with respect to the cover plate. The nozzle supplies the rinse liquid toward the cover plate from the second discharging port at the ascending position and supplies the rinse liquid toward the substrate from the first discharging port at the descending position.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 10A and 10B are detailed views illustrating a top plate member and a top plate nozzle, respectively.

DETAILED DESCRIPTION

Figure 1:
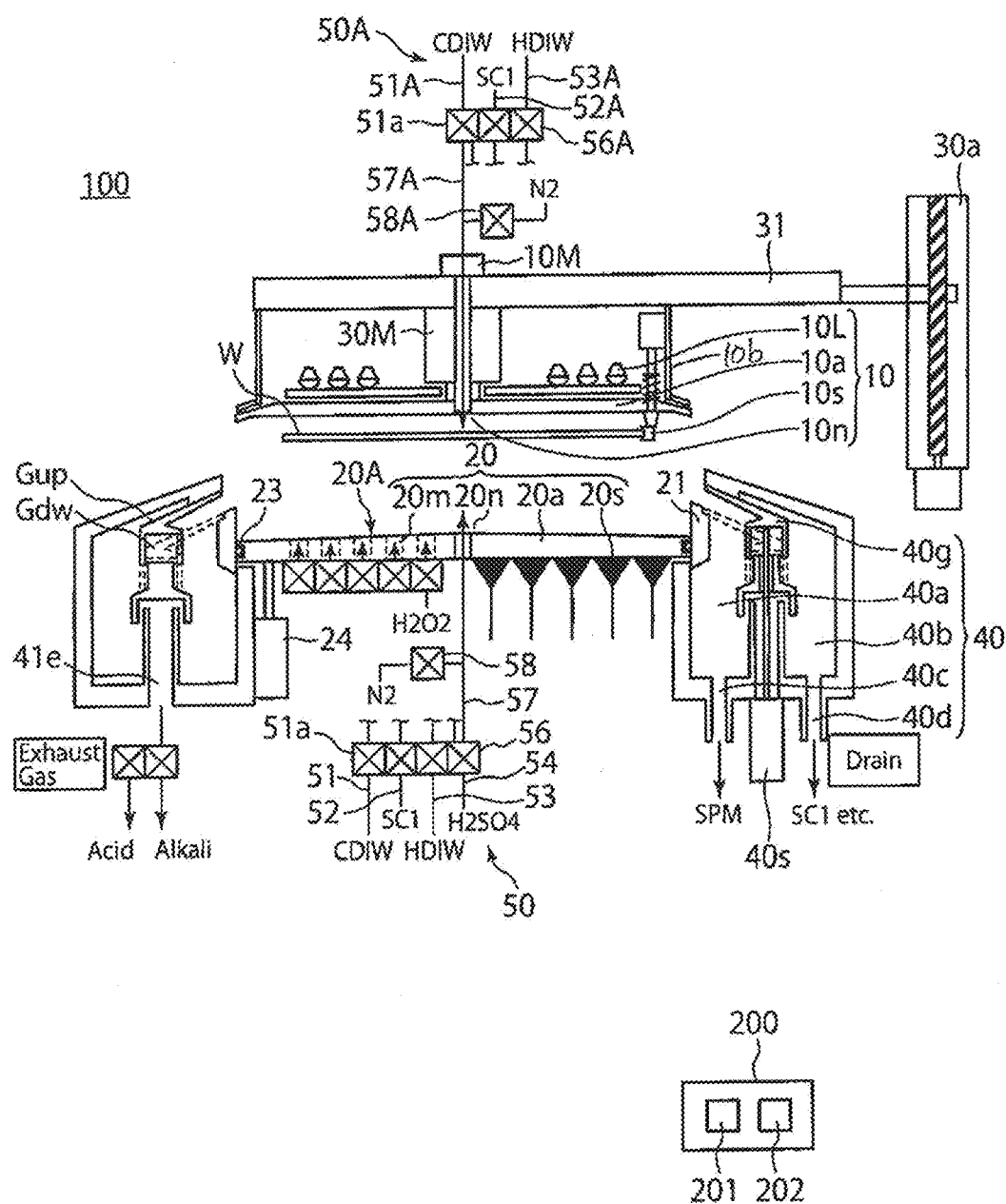
FIG. 1 is a schematic cross-sectional view illustrating a liquid processing apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the liquid processing process, there is a concern that mist may be attached to the cover plate. In a process following the liquid processing process, the mist attached to the cover plate drops onto the substrate causing a particle.

The present disclosure has been made in an effort to provide a liquid processing apparatus, a liquid processing method, and a storage medium capable of cleaning a substrate holder that holds a substrate from above or a cover plate that rotates together with a substrate during the liquid processing process, using a rinse liquid used for a substrate.

The present disclosure provides a liquid processing apparatus comprising: a cover plate that covers a substrate from above; a cover plate rotating mechanism that rotates the cover plate; a nozzle including a first discharging port provided in the rotational center portion of the cover plate and configured to supply a rinse liquid toward the substrate, and a second discharging port configured to supply the rinse liquid toward the cover plate; and a nozzle driving unit that moves the nozzle into an ascending position or a descending position with respect to the cover plate. The nozzle supplies the rinse liquid toward the cover plate from the second discharging port at the ascending position and supplies the rinse liquid toward the substrate from the first discharging port at the descending position.

In the above-described liquid processing apparatus, the second discharging port of the nozzle radially supplies the rinse liquid toward the cover plate. The nozzle is a cylindrical body having a lower flange, and the lower flange is provided with the first discharging port and the second discharging port.

In the above-described liquid processing apparatus, the cover plate includes a top-side substrate holder that rotatably holds the substrate in the horizontal direction.

The above-described liquid processing apparatus further includes a storage member bottom portion to opposite the lower surface of the substrate held by the top-side substrate holder, a storage member bank portion provided in the outer peripheral side of the storage member bottom portion to surround the storage member bottom portion, and a driving unit that adjusts the separated distance between the top-side substrate holder and the storage member bottom portion.

The above-described liquid processing apparatus is provided with a cup part that surrounds the storage member bank portion, and the cup part includes a first annular liquid receiving portion and a second annular liquid receiving portion provided in the outer peripheral side than the first liquid receiving portion.

The above-described liquid processing apparatus further includes a bottom-side substrate holder that rotatably holds the substrate from the below.

The above-described liquid processing apparatus is provided with a cup part that surrounds the bottom-side substrate holder, and the cup part includes a first annular liquid receiving portion and a second annular liquid receiving portion provided in the outer peripheral side than the first liquid receiving portion. In addition, the nozzle supplies an inert gas from the first discharging port and the second discharging port.

The present disclosure provides a liquid processing method of the above-described liquid processing apparatus, the method includes rotating the cover plate using the cover plate rotating mechanism, supplying the rinse liquid toward the substrate from the first discharging port of the nozzle when the nozzle descends with respect to the cover plate, and supplying the rinse liquid toward the cover plate from the second discharging port of the nozzle when the nozzle ascends with respect to the cover plate.

In the above-described liquid processing method, the nozzle is rinsed at the time of supplying the rinse liquid toward the substrate from the first discharging port. In addition, the rinse liquid is supplied from the first discharging port provided in the nozzle which faces the bottom side when the rinse liquid is supplied toward the substrate from the nozzle, and the rinse liquid is supplied from the second discharging port provided in the nozzle which faces the lateral side when the rinse liquid is supplied toward the cover plate.

In the above-described liquid processing method, the nozzle is a cylindrical body having a lower flange and the lower flange is provided with the first discharging port and the second discharging port. The rinse liquid is supplied from the first discharging port provided in the bottom part of the lower flange which faces the bottom side when the rinse is supplied toward the substrate from the nozzle, and the rinse liquid is supplied from the second discharging port provided in the side surface of the lower flange which faces the lateral side when the rinse is supplied toward the cover plate from the nozzle.

The above-described liquid processing method further includes a process in which the nozzle descends with respect to the cover plate, an inert gas is sprayed to the substrate from the first discharging port and the second discharging port of the descended nozzle, thereby drying the nozzle using the inert gas.

The present disclosure provides a non-transitory computer-readable storage medium storing a computer program that, when executed, causes a computer to perform a liquid processing method, the method including: rotating the cover plate using the cover plate rotating mechanism, supplying the rinse liquid toward the substrate from the first discharging port of the nozzle when the nozzle descends with respect to the cover plate, and supplying the rinse liquid toward the cover plate from the second discharging port of the nozzle when the nozzle ascends with respect to the cover plate.

According to the present disclosure, the cover plate may be effectively cleaned during the liquid processing process.

First Embodiment

Hereinafter, a first exemplary embodiment of the present disclosure will be described in detail, with reference to the attached drawings. In all of the appended drawings, the same or corresponding members (or components) are designated with the same or corresponding reference numerals to omit repeated descriptions.

(Configuration of Liquid Processing Apparatus)

First, referring to FIG. 1, a liquid processing apparatus according to an exemplary embodiment of the present disclosure will be described. In the present exemplary embodiment, a semiconductor wafer (a "wafer") is used for a substrate to be processed. As illustrated in FIG. 1, a liquid processing apparatus 100 includes: a substrate holder (top-side substrate holder) 10 that holds a wafer W, of which a surface formed with a circuit pattern (pattern surface) thereof faces down-side from above; a storage member bottom portion 20 provided so as to opposite the lower surface of the held wafer W (circuit pattern formed surface; pattern surface); a storage member bank portion 21 provided in the outer peripheral side of storage member bottom portion 20 so as to surround storage member bottom portion 20; and a plate driving unit 30a that adjusts the separated distance between substrate holder 10 and storage member bottom portion 20. Further, a cup part 40 is provided around storage member bank portion 21 collecting the liquid supplied to wafer W and discharging the liquid to a first liquid receiving portion 40a and a second liquid receiving portion 40b as described below.

Substrate holder 10 serves as a top-side substrate holder that holds wafer W from above and also serves as a cover plate that covers wafer W from above. Such substrate holder 10 includes an annular-shaped top plate member 10a that includes a top plate nozzle 10n in the central portion thereof, a cylindrical-shaped circumference portion 10b located in the outer peripheral of top plate member 10a, and heating units 10L that heat wafer W.

Top plate member 10a holds wafer W in a position where the pattern surface of wafer W faces down-side. Liquid is supplied to the upper surface of wafer W (surface that is opposite to the pattern surface) from top plate nozzle 10n. Circumference portion 10b has an inner diameter slightly larger than the outer diameter of wafer W, and claw units 10s are provided in a predetermined interval extending from circumference portion 10b in a direction toward the center. In this case, three claw units 10s may be provided in circumference portion 10b at an equal interval. Claw units 10s hold wafer W in a state where wafer W is located below top plate nozzle 10n. Heating units 10L are provided on top plate member 10a to heat wafer W to a predetermined temperature so that the temperature of the liquid on wafer W is maintained uniformly. Heating units 10L may use, for example, an LED.

Storage member bottom portion 20 includes a base plate nozzle 20n in the center portion thereof, and an annular-shaped base plate member 20a including a plurality of discharging ports 20m (see, e.g., FIG. 4) which are disposed toward the peripherals from the center portion. Base plate member 20a includes an ultrasonic vibrating plate 20s (see, e.g., FIG. 5) as described below. Base plate nozzle 20n and discharging ports 20m supply liquid to the lower surface of wafer W.

Storage member bank portion 21 is a cylinder-shaped member provided to surround the outer peripheral of base plate member 20a. Storage member bank portion 21 may move such that the relative position relationship with base plate member 20a is changed. When the upper end of storage member bank portion 21 is disposed higher than the upper end of base plate member 20a, base plate member 20a and storage member bank portion 21 both form a storage bath 20A capable of storing a liquid. In this case, in order to prevent the liquid stored in storage bath 20A from being leaked from the gap between base plate member 20a and storage member bank portion 21, a sealing member 23 such as, for example, O-ring is provided in the slidable moving portion of base plate member 20a and storage member bank portion 21. Herein, a method that changes the relative position relationship of base plate member 20a and storage member bank portion 21 may be a method in which any one of base plate member 20a and storage member bank portion 21 moves using a driving mechanism 24 or a method in which both of base plate member 20a and storage member bank portion 21 move relatively using a driving mechanism (not illustrated).

Top plate member 10a of substrate holder 10 is held by a connection member 31 through an intervening motor 30M that rotatably holds top plate member 10a, connection member 31 is connected to plate driving unit 30a as described above, and thus, plate driving unit 30a may move substrate holder 10 between a transfer position where wafer W is transferred by a transport mechanism 61 as described below and a processing position where wafer W is liquid processed. Motor 30M rotates top plate member 10a with respect to connection member 31, and as a result, wafer W held by top plate member 10a is also rotated.

As described above, plate driving unit 30a may decrease the separated distance between substrate holder 10 and storage member bottom portion 20. At this time, wafer W held by top plate member 10a of substrate holder 10 is immersed into the liquid (for example, a cleaning liquid) stored in storage bath 20A.

Cup part 40 includes a first annular liquid receiving portion 40a, a second annular liquid receiving portion 40b provided in the outer peripheral side than first liquid receiving portion 40a, and a movable partition guide 40g that partitions first liquid receiving portion 40a and second liquid receiving portion 40b. Partition guide 40g is driven by a guide driving unit 40s in the up-down direction. The liquid flowed in first liquid receiving portion 40a of cup part 40 is discharged from a liquid drain port 40c, and the liquid flowed in second liquid receiving portion 40b is discharged from a liquid drain port 40d. The atmosphere gas in liquid processing apparatus 100 is exhausted through an exhaust port 41e provided in cup part 40. Herein, partition guide 40g may guide the liquid into liquid drain port 40c when partition guide 40g is located in an upper guide position $G_{up}$ (a position indicated by a solid line in FIG. 1) and may guide the liquid into liquid drain port 40d when partition guide 40g is located in a lower guide position $G_{dw}$ (a position indicated by a broken line in FIG. 1).

A liquid supply source 50 is connected to base plate nozzle 20n. In the present exemplary embodiment, liquid supply source 50 has four pipes 51 to 54. With respect to the liquid to be supplied (processing liquid), SC1 is supplied from pipe 52 as a cleaning liquid, a deionized water at room temperature CDIW is supplied from pipe 51 and a deionized water at high temperature HDIW is supplied from pipe 53 as a rinse liquid, and sulfuric acid ($H_2SO_4$) is supplied from pipe 54 as a processing liquid for a resist removal. In addition, a group valve 56 is provided for pipes 51 to 54. The inlet ports of group valve 56 are connected to pipes 51 to 54, and the outlet ports of group valve 56 are connected to a supplying pipe 57. In addition, three-way valves are provided in group valve 56, which are corresponding to pipes 51 to 54, respectively.

Herein, a three-way valve is used to selectively supply a desired liquid into supplying pipe 57 by selectively opening/closing the valve. Specifically, when a three-way valve 51a is opened, deionized water CDIW that flows in pipe 51 is flowed to supplying pipe 57. Meanwhile, in the other three-way valves which are closed, each of the liquids that flows in the corresponding one of pipes 52 to 54 flows in the one of pipes 52 to 54 as it is, and are not flowed in to supplying pipe 57.

A configuration where a liquid is selectively supplied to supplying pipe 57 may be made by providing a plurality of individual valves in pipes 51 to 54 instead of group valve 56 as described above.

Figure 9:
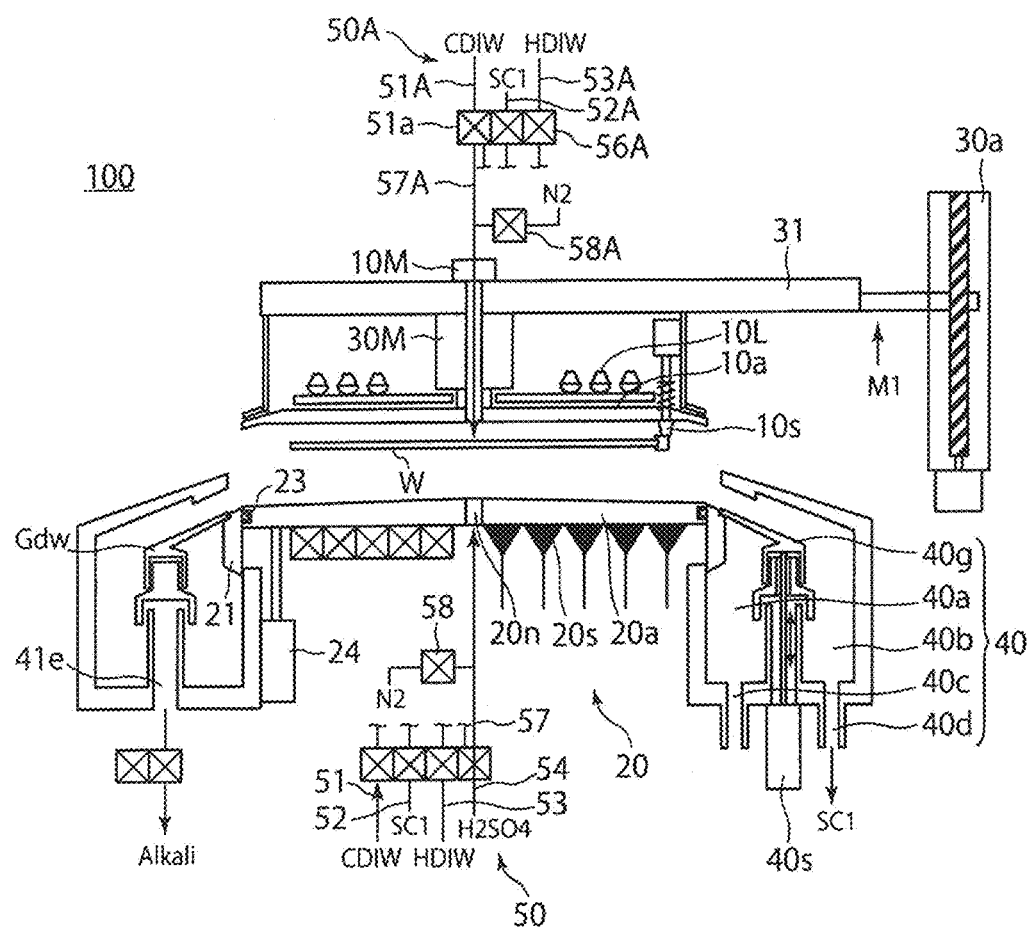
FIG. 9 is an explanatory view describing a dry processing in the present exemplary embodiment.

Supplying pipe 57 is connected to base plate nozzle 20n through a mass flow controller and a supplying valve which are not illustrated. Supplying pipe 57 is also connected to a drain pipe which is not illustrated. The drain pipe includes an opening/closing valve. A pipe that supplies a nitride gas, as an inert gas, used in a dry processing as described below (see, e.g., FIG. 9), is connected to supplying pipe 57 through an opening/closing valve.

In base plate member 20a, a plurality of discharging ports 20m are disposed from the center portion toward the peripheral portions. From the plurality of discharging ports 20m, hydrogen peroxide is discharged through an opening/closing valve as a processing liquid used in an SPM processing as described below (see, e.g., FIG. 4).

Further, liquid supply source 50 is connected to top plate nozzle 10n of the substrate holder. Liquid supply source 50A includes pipes 51A, 52A, 53A. SC1 is supplied from pipe 52A as a cleaning liquid, and deionized water at room temperature CDIW is supplied from pipe 51A and deionized water at high temperature HDIW is supplied from pipe 53A as a rinse liquid. In addition, a group valve 56A is provided for pipes 51A to 53A. The inlet ports of group valve 56A are connected to pipes 51A to 53A, and the outlet ports of group valve 56A are connected to a supplying pipe 57A. In addition, three-way valves are provided in group valve 56A, which are corresponding to pipes 51A to 53A, respectively.

Herein, a three way valve is used to supply a desired liquid selectively into supplying pipe 57A by selectively opening/closing the valve. Specifically, when a three-way valve 51a is opened, deionized water CDIW that flows in pipe 51A is flowed in to supplying pipe 57A. Meanwhile, in the other three-way valves which are closed, each of the liquids that flows in the corresponding one of pipes 52A and 53A flows in the one of pipes 52A and 53A as it is, and the liquids are not flowed in to supplying pipe 57A.

A configuration where a liquid is selectively supplied to supplying pipe 57A may be made by providing a plurality of individual valves instead of group valve 56A as described above in pipes 51A to 53A.

Supplying pipe 57A is connected to top plate nozzle 10n through a mass flow controller (not illustrated) and a supplying valve. Supplying pipe 57A is also connected to a drain pipe which is not illustrated. The drain pipe includes an opening/closing valve. A pipe that supplies a nitride gas, as an inert gas, used in a dry processing as described below (see, e.g., FIG. 9), is connected to supplying pipe 57A through an opening/closing valve.

Next, top plate nozzle 10n will be further described with reference to FIGS. 10A, 10B, 11 and 12. As illustrated in FIGS. 10A, 10B, 11 and 12, top plate nozzle 10n is provided such that top plate nozzle 10n may move in the up-down direction with respect to top plate member 10a of substrate holder 10. Specifically, top plate nozzle 10n is driven using a nozzle driving unit 10M provided in the upper side of connection member 31.

Top plate nozzle 10n has a cylinder shape and does not rotate. In top plate nozzle 10n, the lower end portion (bottom portion) 10E thereof is provided with a first discharging port 11 that supplies a liquid (for example, a rinse liquid) downwardly toward wafer W and a second discharging port 12 that supplies the rinse liquid laterally toward top plate member 10a. A first flow line 11a communicated with first discharging port 11 and a second flow line 12a communicated with second discharging port 12 extend independently each other within top plate nozzle 10n. Top plate nozzle 10n is a cylindrical body having a lower flange. By widening the area of the bottom portion, the space between the bottom portion and the substrate is filled with a rinse liquid, a liquid film is formed on wafer W, and thus, the bounce of the liquid may be suppressed. The lower surface of top plate nozzle 10n may be effectively cleaned.

Figure 11:
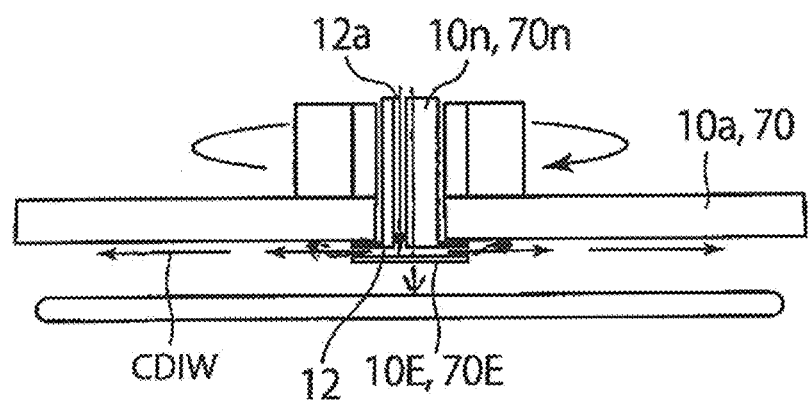
FIG. 11 is a view illustrating a state where the top plate member is cleaned with the CDIW from the top plate nozzle.
Figure 12:
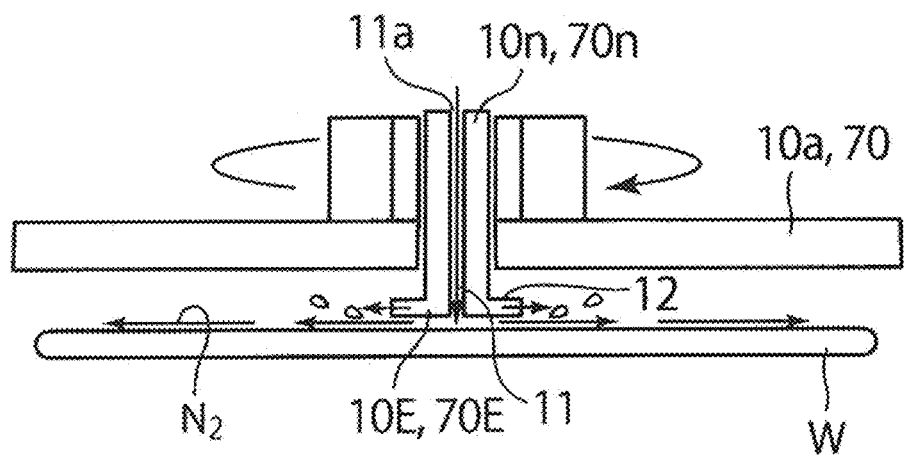
FIG. 12 is a view illustrating a state where the wafer is dried with N2 from the top plate nozzle.

In FIGS. 10A, 10B, and 12, only first discharging port 11 and first flow line 11a are illustrated, but second discharging port 12 and second flow line 12a are not illustrated for convenience sake. In FIG. 11, only second discharging port 12 and second flow line 12a are illustrated, but first discharging port 11 and first flow line 11a are not illustrated for convenience sake.

Also, as illustrated in FIG. 1, liquid processing apparatus 100 includes a controller (control unit) 200 that integrally controls the entire operations thereof. Controller 200 controls the operations of all of the functional components (for example, plate driving unit 30a, motor 30M, group valves 56, 56A, and guide driving unit 40s). Controller 200 may be implemented using, for example, a general purpose computer as a hardware and a program (an apparatus control program and a processing recipe) to operate the computer as a software. The software may be stored on a storage medium such as, for example, a hard disc drive which is fixedly provided in the computer, or on a storage medium such as, for example, a CD-ROM, a DVD, and a flash memory which are removably set in the computer. The storage media are indicated by a reference numeral 201 in FIG. 1. A processor 202 calls and executes a predetermined processing recipe from storage medium 201 based on, for example, instructions from a user interface (not illustrated) as needed, and as a result, each functional component of liquid processing apparatus 100 is operated to perform a predetermined processing.

(Liquid Processing Method)

Next, the operations of the present exemplary embodiment including the configuration as described above will be described.

Figure 2:
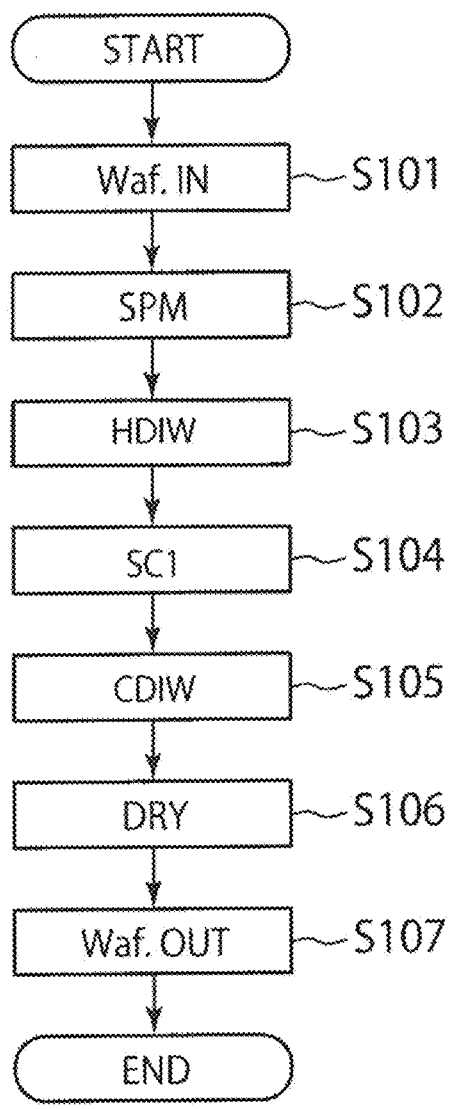
FIG. 2 is a flow chart describing a liquid processing method according to the present exemplary embodiment.

FIG. 2 is a flow chart illustrating a liquid processing method according to the present exemplary embodiment. FIGS. 3 to 9 are explanatory views that describe each process of the liquid processing method to be implemented. Referring to FIG. 2, each process of FIGS. 3 to 9 will be described.

First, at step S101 in FIG. 2 (and FIG. 3), wafer W is carried in to liquid processing apparatus 100 by transport mechanism 61 (see, e.g., FIG. 3) in a state where pattern surface thereof faces downward, and wafer W is transferred to a place below top plate member 10a of substrate holder 10. That is, wafer W is transferred from transport mechanism 61 to the circumference portion that is located below top plate member 10a by a transfer mechanism (not illustrated) and then, wafer W is held by claw units 10s of the circumference portion (spin chuck). At this time, wafer W is held while the pattern surface thereof faces downward. Then, the process proceeds to step S102.

At step S102 in FIG. 2 (and FIG. 4), a resist formed on the surface of wafer W is removed (e.g., detached).

Figure 4:
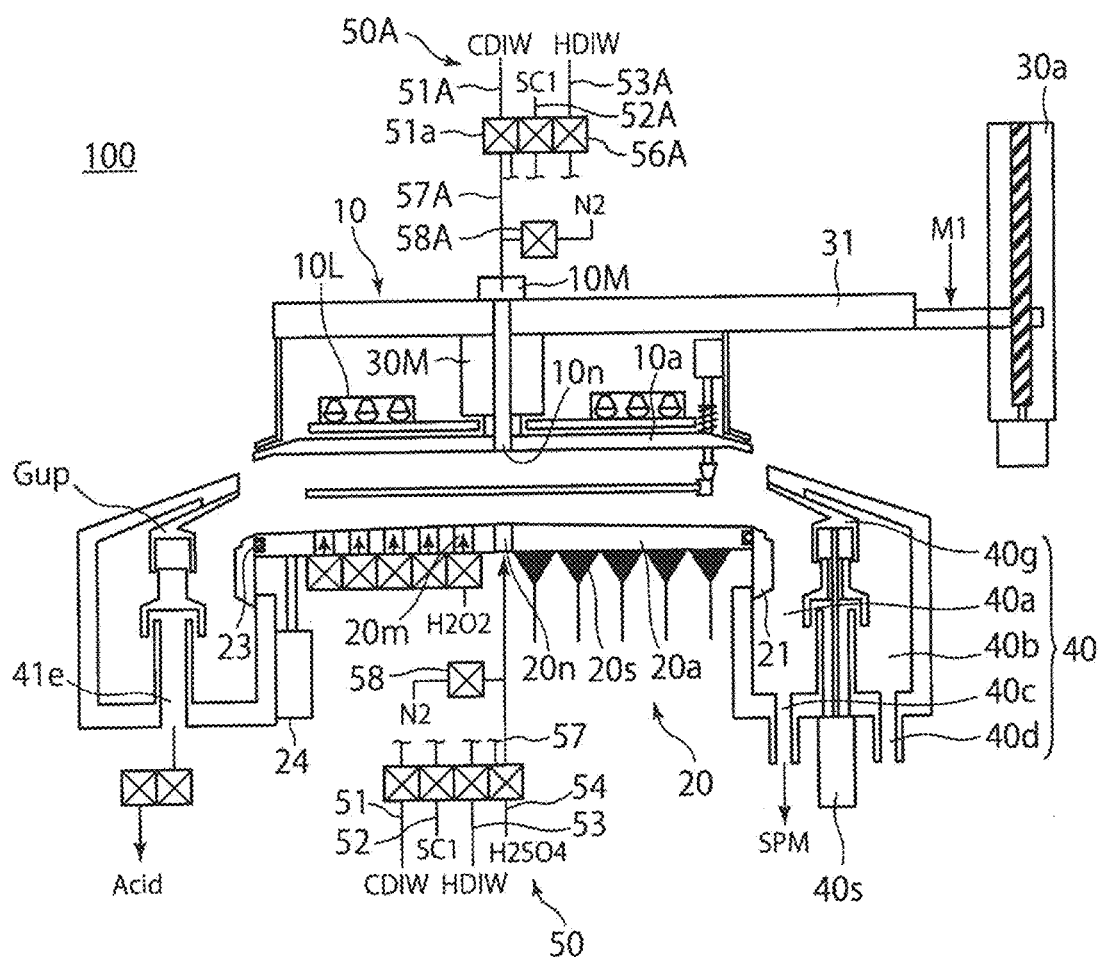
FIG. 4 is an explanatory view describing an SPM processing in the present exemplary embodiment.

Specifically, first, in FIG. 4, wafer W held by top plate member 10a is moved downward toward cup part 40 by plate driving unit 30a (M1). Further, wafer W is rotated by motor 30M at a predetermined rotational speed (for example, 500 rpm). At this time, partition guide 40g is located in upper guide position $G_{up}$.

Next, a three-way valve in pipe 54 is opened to discharge sulfuric acid ($H_2SO_4$) toward wafer W from base plate nozzle 20n. Further, hydrogen peroxide ($H_2O_2$) is discharged toward wafer W from discharging ports 20m. At this time, a mixed liquid of the sulfuric acid and the hydrogen peroxide is generated on the surface of wafer W. In the mixed liquid, a chemical reaction of the sulfuric acid and the hydrogen peroxide ($H_2SO_4+H_2O_2 \rightarrow H_2SO_5+H_2O$) occurs to generate SPM including $H_2SO_5$ having a strong oxidizing power.

The sulfuric acid and the hydrogen peroxide which are discharged into the pattern surface of wafer W are dispersed toward the outer peripherals from the center of the pattern surface of wafer W by a centrifugal force caused by the rotation of wafer W, thereby forming a liquid film of SPM on the pattern surface. As a result, unnecessary resist that remains on the pattern surface of wafer W may be removed by the oxidization of the SPM. Further, the temperature of the SPM on wafer W is decreased toward the outer peripheral of wafer W. As a result, wafer W is heated by heating units 10L to control the temperature of the liquid on wafer W to be maintained equally. Further, the liquid film of SPM on the pattern surface of wafer W is scattered from the outer peripheral by the centrifugal force to be received into first liquid receiving portion 40a, and then is discharged from liquid drain port 40c.

Figure 5:
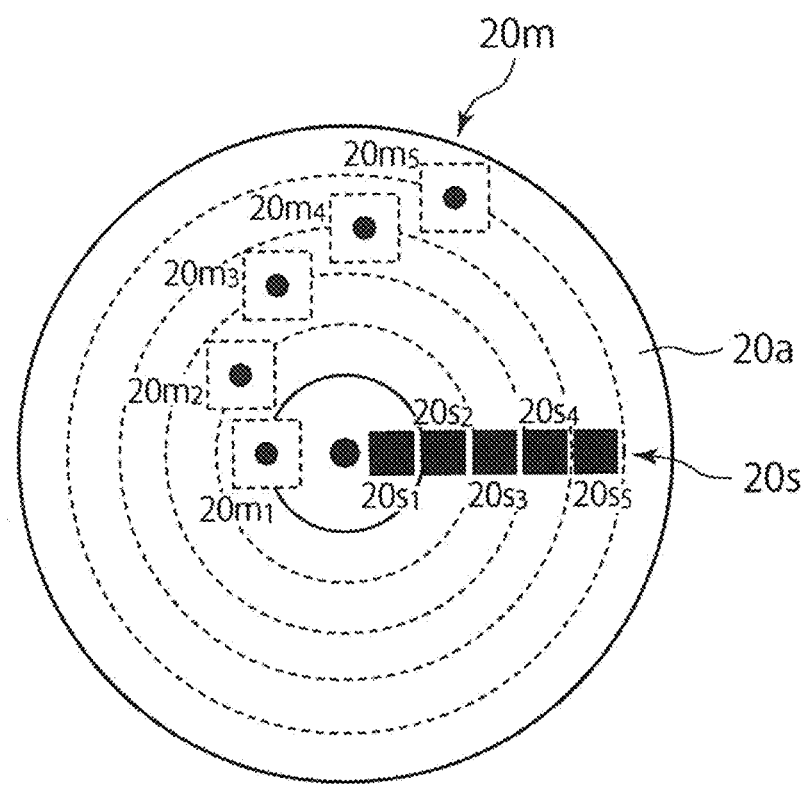
FIG. 5 is a plan view illustrating a base plate member in the present exemplary embodiment.
Figure 6:
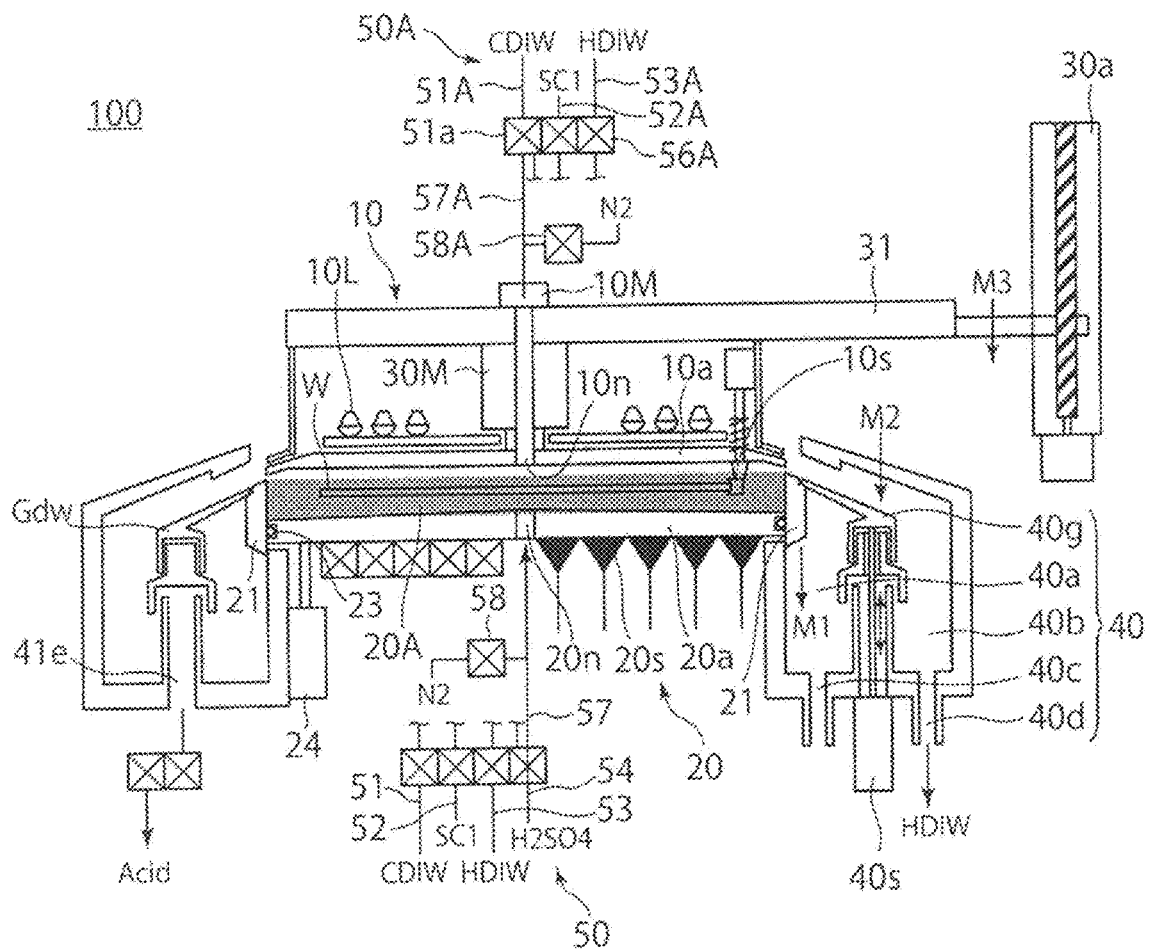
FIG. 6 is an explanatory view describing an HDIW processing in the present exemplary embodiment.
Figure 7:
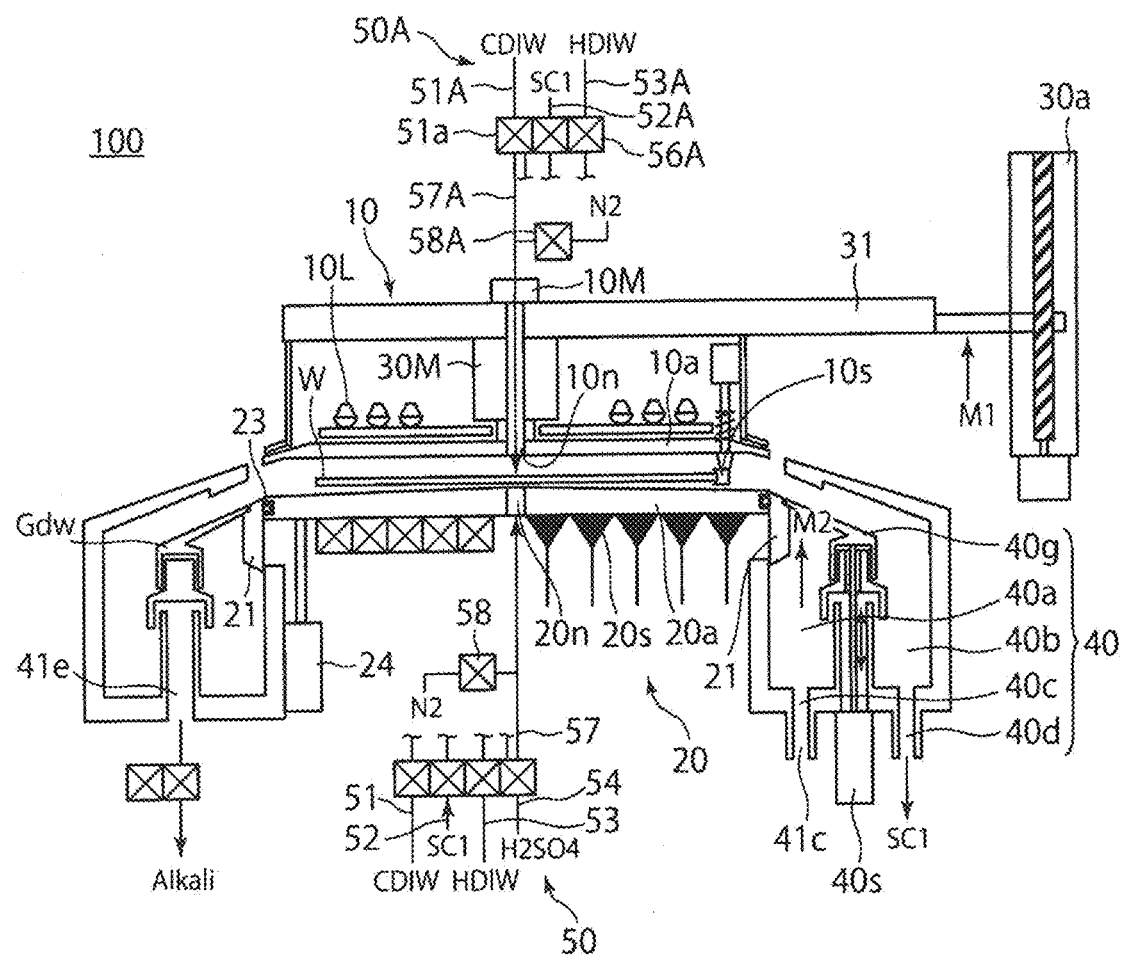
FIG. 7 is an explanatory view describing an SC1 processing in the present exemplary embodiment.
Figure 8:
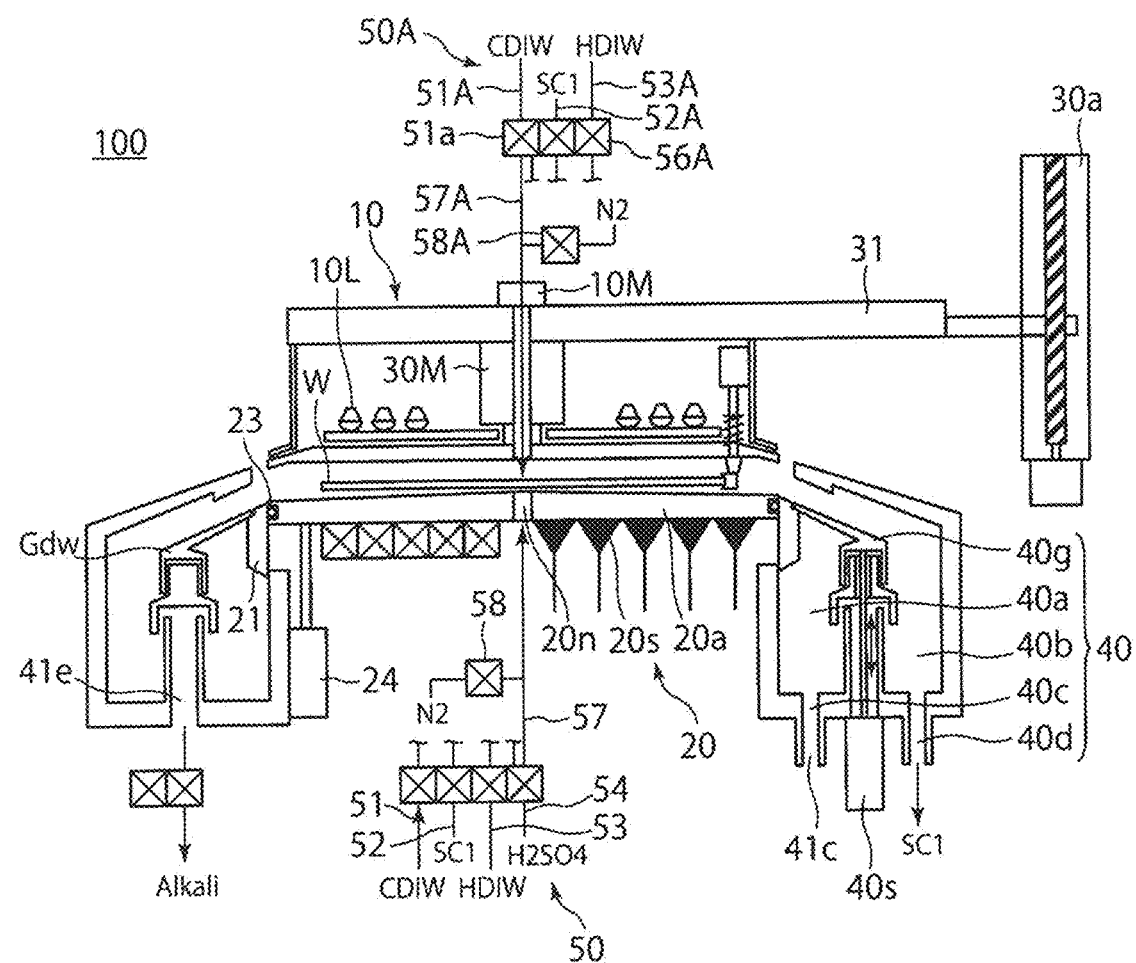
FIG. 8 is an explanatory view describing a CDIW processing in the present exemplary embodiment.

Herein, FIG. 5 illustrates a plan view that describes the positions of discharging ports 20m for discharging the hydrogen peroxide. In the present exemplary embodiment, five discharging ports $20m_1$ to $20m_5$ are provided. Discharging ports $20m_1$ to $20m_5$ may be helically disposed from the center portion of the circular surface of base plate member 20a. The flow rate of the hydrogen peroxide discharged from discharging ports 20m is controlled by an opening/closing valve (not illustrated).

As described above, when the substrate processing that removes the resist formed on the pattern surface of wafer W is completed, the process proceeds to step S103.

At step S103 in FIG. 2 (and FIG. 6), an immersion processing that immerses wafer W into HDIW (rinse liquid) is performed.

Specifically, first, base plate member 20a descends (M1) to dispose the upper end of storage member bank portion 21 higher than the upper end of base plate member 20a, thereby forming storage bath 20A capable of storing a liquid. Next, a three-way valve in pipe 53 is opened to supply HDIW from base plate nozzle 20n, thereby store the HDIW into storage bath 20A. Further, partition guide 40g is driven by guide driving unit 40s, the position of partition guide 40g moves downward (M2), and the liquid is discharged to liquid drain port 40d.

Next, plate driving unit 30a moves top plate member 10a of substrate holder 10 downward (M3), and wafer W is immersed into the stored HDIW in storage bath 20A to perform the immersion processing for a predetermined time. Herein, in the immersion processing, cleaning (overflow cleaning) is performed while the HDIW is continuously supplied and the liquid is discharged to liquid drain port 40d. By the DIP processing (immersion processing), the removed resist that remains on the surface of wafer W or the SPM is removed, and thus, wafer W may be equally cleaned. Further, base plate member 20a on which processing liquid (for example, SPM) used at steps S102 and S103 attached, may be cleaned at the same time during the immersion processing.

Further, wafer W and top plate member 10a may be rotated at a low rotational speed by motor 30M during the immersion processing.

As described above, when the immersion processing is completed, the process proceeds to step S104.

At step S104 in FIG. 2 (and FIG. 7), a processing that cleans (rotation cleans) wafer W with SC1 while wafer W is rotated, is performed.

Specifically, first, plate driving unit 30a moves top plate member 10a of substrate holder 10 upward (M1), and wafer W is pulled up out of the HDIW in storage bath 20A. Further, base plate member 20a ascends (M2), the upper end of storage member bank portion 21 is lowered than the upper end of base plate member 20a, and then, the HDIW used at step S103 is discharged from liquid drain port 40d of second liquid receiving portion 40b. At this time, discharging the HDIW used in the immersion processing at step S103 and rotation cleaning as described below may be simultaneously performed.

Next, motor 30M rotates wafer W and top plate member 10a at a predetermined rotational speed, and SC1 is discharged from top plate nozzle 10n and base plate nozzle 20n to the upper/lower surfaces of wafer W being rotated. At this time, the SC1 discharged to the upper/lower surfaces of wafer W forms a liquid film on the surfaces of wafer W by the centrifugal force caused by the rotation of wafer W. As a result, particles attached on the surfaces of wafer W may be removed. Further, the liquid film of SC1 on the surfaces of wafer W scatters from the outer peripheral of wafer W by the centrifugal force. The scattered SC1 is received into second liquid receiving portion 40b of cup part 40, and the scattered SC1 is discharged from liquid drain port 40d. Herein, the surfaces of wafer W include the upper surface and the lower surface of wafer W.

As described above, the rotation cleaning of wafer W is completed, the process proceeds to step S105.

At step S105 in FIG. 2 (and FIG. 8), a processing that rinses wafer W with CDIW as a post processing of the rotation cleaning of SC1 is performed.

At step S105, the CDIW (rinse liquid) is supplied onto wafer W and the rinse processing is performed. The processing process by the CDIW will be described with reference to FIGS. 10A and 10B.

First, motor 30M rotates wafer W and top plate member 10a at a predetermined rotational speed, and the CDIW is supplied from top plate nozzle 10n and base plate nozzle 20n to the upper/lower surfaces of wafer W being rotated.

Hereinafter, the processing process in top plate nozzle 10n side in this case will be described.

When step S105 is initiated, in the top plate nozzle 10n side, top plate nozzle 10n descends with respect to top plate member 10a by nozzle driving unit 10M disposed on connection member 31, and the lower end portion 10E of top plate nozzle 10n is spaced from top plate member 10a and approaches to the upper surface of wafer W.

In this state, the CDIW is supplied downward to the center portion of the upper surface of wafer W from first discharging port 11 through first flow line 11a of top plate nozzle 10n. The supplied CDIW fills the space between lower end portion 10E of top plate nozzle 10n and the upper surface of wafer W to rinse the lower surface of lower end portion 10E, and is dispersed to the entire upper surface of wafer W to rinse the upper surface of wafer W. As illustrated in FIG. 10B, the lower end portion 10E is rinsed using the liquid film of the CDIW.

At this time, CDIW is supplied from base plate nozzle 20n to the pattern surface which is the lower surface of wafer W.

As a result, the upper/lower surfaces of wafer W may be rinsed and the nozzle also may be rinsed.

Next, as illustrated in FIG. 11, nozzle driving unit 10M moves up top plate nozzle 10n with respect to top plate member 10a, and thus, lower end portion 10E of top plate nozzle 10n approaches to top plate member 10a.

In the state, while top plate member 10a and wafer W are rotated, the CDIW is supplied laterally and radially toward the lower surface of top plate member 10a from second discharging port 12 through second flow line 12a of top plate nozzle 10n. As described above, the CDIW is supplied in a radial direction toward the lower surface of top plate member 10a from second discharging port 12, and thus, the lower surface of top plate member 10a may be effectively cleaned by the CDIW. At this time, the CDIW may drop from top plate member 10a on the upper surface of wafer, and thus, the CDIW is supplied from first discharging port 11 onto the upper surface of wafer W to form a liquid film on wafer W. Even if the liquid drops, the liquid may flow out along with the liquid film.

That is, the SPM used at step S101 and the SC1 used at step S104 may be attached to the lower surface of top plate member 10a, but these SPM and SC1 may be effectively removed from the lower surface of top plate member 10a by supplying the CDIW to the lower surface of top plate member 10a.

As described above, when the rinse processing is completed, the process proceeds to step S106.

At step S106 in FIG. 2 (and FIG. 9), a processing that dries wafer W while wafer W is rotated is performed.

Specifically, the discharging of the CDIW from top plate nozzle 10n and base plate nozzle 20n is stopped first. Further, plate driving unit 30a moves top plate member 10a of substrate holder 10 (M1) to more upwardly. Next, opening/closing valves 58 and 58A are opened, and thus, an inert gas (N2 gas) is sprayed from top plate nozzle 10n and base plate nozzle 20n. At this time, top plate member 10a and wafer W are continuously rotated, the remaining CDIW on the surfaces of wafer W is removed, and thus, the surfaces of wafer W may be dried.

Next, the drying process in top plate nozzle 10n side will be described in detail as below.

As illustrated in FIG. 12, when N2 gas is supplied from top plate nozzle 10n, top plate nozzle 10n descends in advance by nozzle driving unit 10M with respect to top plate member 10a, and lower end portion 10E of top plate nozzle 10n is spaced from top plate member 10a.

In this state, opening/closing valve 58A is opened, and as a result, N2 gas is supplied downward to the center portion of wafer W from first discharging port 11 of top plate nozzle 10n, and N2 gas is supplied laterally to the upper surface of wafer W from second discharging port 12.

As a result, the remaining CDIW on the upper surface of wafer W is removed.

In this case, since top plate nozzle 10n descends with respect to top plate member 10a and approaches to wafer W, the N2 gas supplied from first discharging port 11 of top plate nozzle 10n may also remove the remaining CDIW on lower end portion 10E of top plate nozzle 10n. As a result, top plate nozzle 10n itself is dried by the N2 gas.

As described above, when the dry processing is completed, the process proceeds to step S107.

Figure 3:
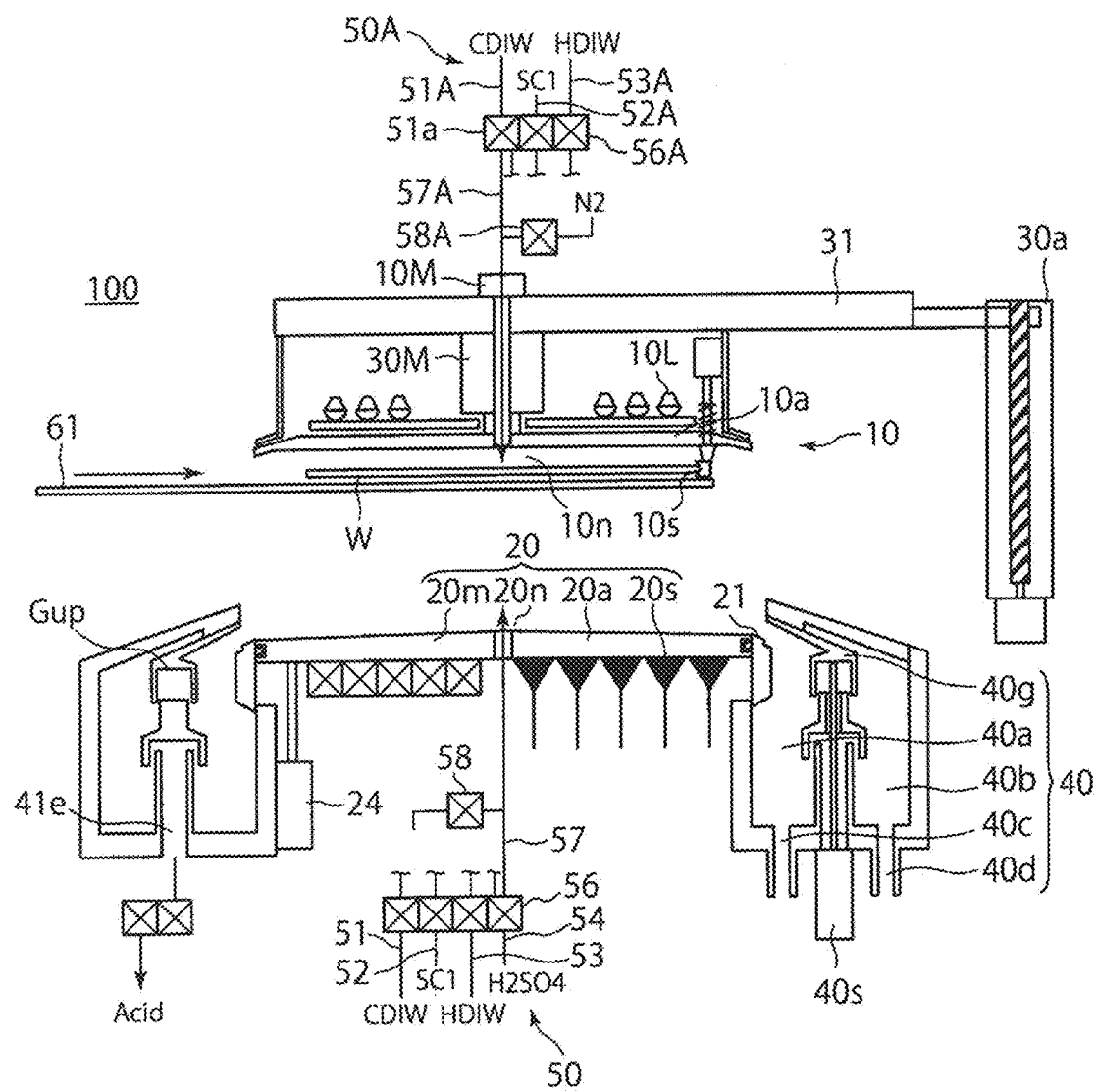
FIG. 3 is an explanatory view describing a carrying-in operation of a wafer in the present exemplary embodiment.

At step S110 in FIG. 2, wafer W having been processed is carried out to the outside of liquid processing apparatus 100 by transport mechanism 61 (see, e.g., FIG. 3). The method of carrying out is the same as a reverse order of step S101, and thus, the description thereof will be omitted. When the carrying-out is completed, the process proceeds to "END" in FIG. 2, and thus, the operation is completed.

In the above-described exemplary embodiment, a substrate processing of the wafer is described as an example, but the present disclosure may be applied to a case where a substrate is liquid processed in manufacturing a substrate such as, for example, a glass substrate for a flat panel display.

As described above, according to the present exemplary embodiment, top plate member 10a may be effectively cleaned during the liquid processing process.

Second Embodiment

Next, a second exemplary embodiment of the present disclosure will be described with reference to FIG. 13.

Figure 13:
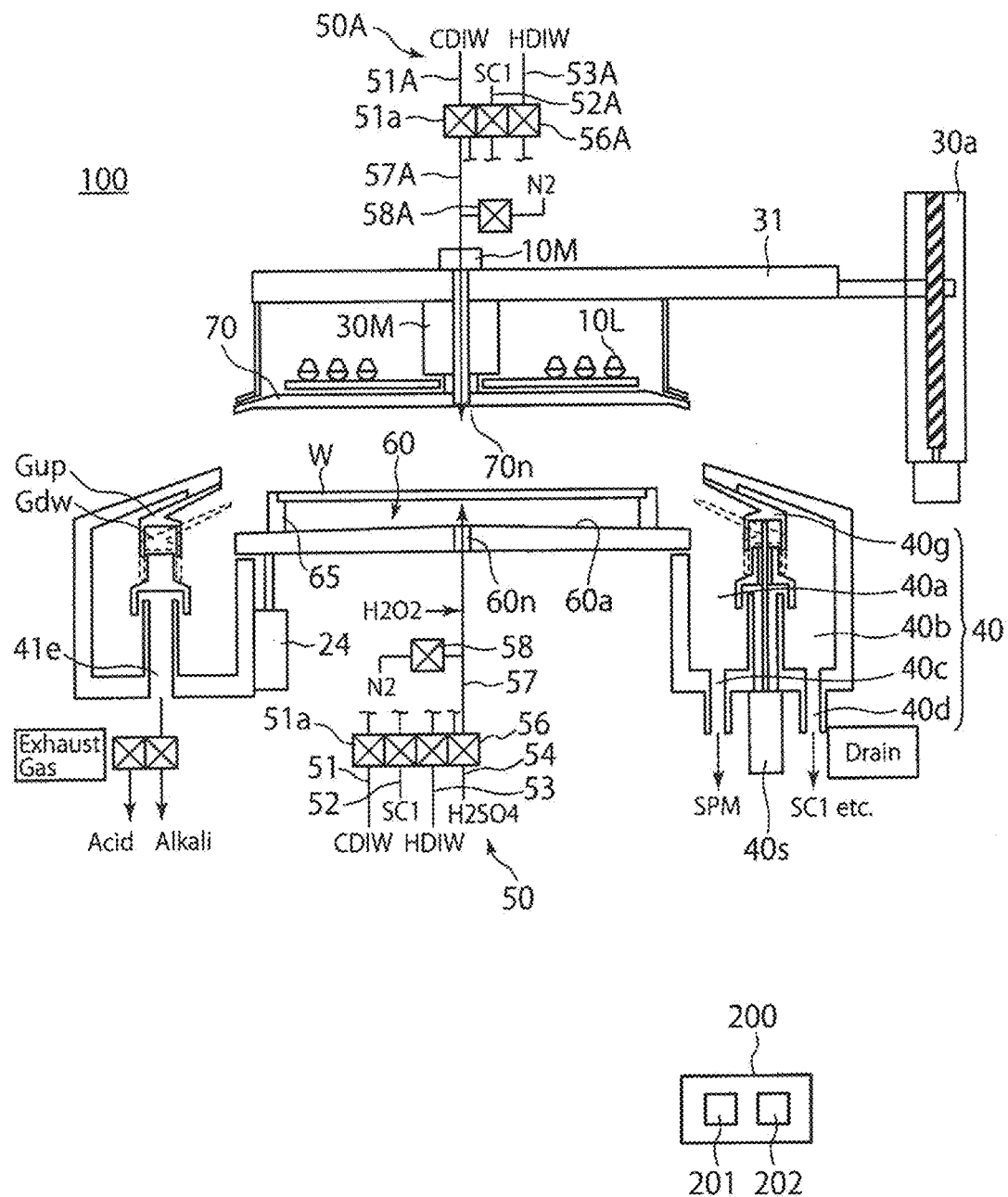
FIG. 13 is a schematic cross-sectional view illustrating a liquid processing apparatus according to a second exemplary embodiment of the present disclosure.

The second exemplary embodiment illustrated in FIG. 13 is substantially the same as the first exemplary embodiment illustrated in FIGS. 1 to 12 except that a top plate (cover plate) 70 is disposed in the same position of top plate member 10a instead of providing top-side substrate holder 10 having top plate member 10a and that wafer W is held by a bottom-side substrate holder 60.

In the second exemplary embodiment illustrated in FIG. 13, the same parts as those of the first exemplary embodiment illustrated in FIGS. 1 to 12 use the same reference numerals and the descriptions thereof will be omitted.

As illustrated in FIG. 13, bottom-side substrate holder 60 that holds wafer W includes a base plate member 60a which is provided rotatably and a plurality of holding members 65 which is provided on base plate member 60a with an equal interval to hold wafer W from lateral side.

Base plate member 60a is provided with a base plate nozzle 60n at the center portion thereof, and a liquid supply source 50 is connected to base plate nozzle 60n. Further, a cup part 40 is provided in the outer peripherals of bottom-side substrate holder 60 and holding members 65 which constitute base plate member 60a.

Top plate 70 provided above wafer W is used to prevent the liquid mist scattered from wafer W during the liquid processing from being scattered upwardly. Top plate 70 is connected to connection member 31 through motor 40M, and connection member 31 is connected to plate driving unit 30a. As a result, plate driving unit 30a may move connection member 31 and top plate 70 in the up-down direction, and top plate 70 may be rotated by motor 30M.

A top plate nozzle 70n that supplies liquid such as, for example, rinse liquid to wafer W is provided in the center portion of top plate 70, and a liquid supply source 50A is connected to top plate nozzle 70n.

Top plate nozzle 70n may be moved in the up-down direction with respect to top plate 70, and specifically, top plate nozzle 70n is driven in the up-down direction by nozzle driving unit 10M provided on connection member 31.

As illustrated in FIGS. 10A, 10B, 11 and 12, in top plate nozzle 70n, a lower end portion 70E thereof is provided with first discharging port 11 that supplies a liquid such as, for example, a rinse liquid downward toward wafer W and a second discharging port 12 that supplies the rinse liquid laterally and radially toward top plate 70. That is, first discharging port 11 that supplies the rinse liquid downward and second discharging port 112 that supplies the rinse liquid laterally and radially are provided in lower end portion 70E of top plate nozzle 70n, and a first flow line 11a communicated with first discharging port 11 and a second flow line 12a communicated with second discharging port 12 extend in top plate nozzle 70n independently each other.

Next, the operations of the present exemplary embodiment including the configuration as described above will be described.

First, at step S101 in FIG. 2, wafer W is carried in to liquid processing apparatus 100 by a transport mechanism in a state where pattern surface thereof faces downward, and wafer W is transferred to bottom-side substrate holder 60.

Next, the process proceeds to step S102, and at step S102 in FIG. 2, a resist formed on the pattern surface of wafer W is removed.

Specifically, first, as illustrated in FIG. 13, plate driving unit 30a moves connection member 31 and top plate 70 downwardly. Further, motor 30M rotates top plate 70 at a predetermined rotational speed (for example, 500 rpm).

Next, base plate member 60a is rotated, and as a result, wafer W is rotated. Then, a three-way valve in pipe 54 is opened to discharge sulfuric acid ($H_2SO_4$) toward the pattern surface of wafer W from base plate nozzle 60n. Further, hydrogen peroxide ($H_2O_2$) is discharged toward the pattern surface of wafer W from base plate nozzle 60n. At this time, a mixed liquid of the sulfuric acid and the hydrogen peroxide is generated on the pattern surface of wafer W, and In the mixed liquid, a chemical reaction of the sulfuric acid and the hydrogen peroxide ($H_2SO_4 + H_2O_2 \rightarrow H_2SO_5 + H_2O$) occurs to generate SPM including $H_2SO_5$ having a strong oxidizing power.

The sulfuric acid and the hydrogen peroxide which are discharged into the pattern surface of wafer W are dispersed toward the outer peripherals from the center of the pattern surface of wafer W by the centrifugal force caused by the rotation of wafer W, thereby forming a liquid film of SPM on the pattern surface. As a result, unnecessary resist formed on the pattern surface of wafer W may be removed by the oxidization of the SPM. Further, the temperature of the SPM on wafer W is decreased toward the outer peripheral of wafer W. As a result, wafer W is heated by heating units 10L above top plate 70 to control the temperature of the liquid on wafer W to be maintained equally. Further, the liquid film of SPM on the pattern surface of wafer W is scattered from the outer peripherals by the centrifugal force to be received into first liquid receiving portion 40a, and then, is discharged from liquid drain port 40c.

As described above, when the substrate processing that removes the resist formed on the pattern surface of wafer W is completed, the process proceeds to step S103.

At step S103 in FIG. 2, a rinse processing that supplies HDIW (rinse liquid) to wafer W is performed.

Specifically, while base plate member 60a and wafer W are rotated and top plate 70 is rotated, the HDIW is supplied to the upper/lower surfaces of wafer W from base plate nozzle 60n and top plate nozzle 70n.

As described above, when the rinse processing using the HIDW is completed, the process proceeds to step S104.

At step S104 in FIG. 2, a processing that cleans (rotation cleans) wafer W with SC1 is performed while base plate member 60a and wafer W are rotated and top plate 70 is rotated.

Specifically, top plate 70 is rotated by motor 30M, and base plate member 60a and wafer W are rotated. Then, the SC1 is discharged from top plate nozzle 70n and base plate nozzle 60n to the upper/lower surfaces of wafer W being rotated. At this time, the SC1 discharged to the upper/lower surfaces of wafer W forms a liquid film on the surfaces of wafer W by the centrifugal force caused by the rotation of wafer W. As a result, the particles attached on the surfaces of wafer W may be removed. Further, the liquid film of SC1 on the surfaces of wafer W scatters from the outer peripheral of wafer W by the centrifugal force. The scattered SC1 is received into second liquid receiving portion 40b of cup part 40, and the scattered SC1 is discharged from liquid drain port 40d.

As described above, the rotation cleaning of wafer W is completed, the process proceeds to step S105.

At step S105 in FIG. 2, a processing that rinses wafer W with CDIW as a post processing of the rotation cleaning of SC1 is performed.

At step S105, the CDIW (rinse liquid) is supplied onto wafer W and the rinse processing is performed. The processing process by the CDIW will be described with reference to FIGS. 10A and 10B.

First, top plate 70 is rotated at a predetermined rotational speed by motor 30M and base plate member 60a and wafer W are rotated. Then, the CDIW is supplied from top plate nozzle 70n and base plate nozzle 60n to the upper/lower surfaces of wafer W being rotated.

Hereinafter, the processing in the top plate nozzle 70n side in this case will be described.

When step S105 is initiated, in top plate nozzle 70n side, top plate nozzle 70n descends in advance with respect to top plate 70 by nozzle driving unit 10M disposed on connection member 31, and lower end portion 70E of top plate 70 is spaced from top plate 70 and approaches to the upper surface of wafer W.

In this state, the CDIW is supplied downwardly toward the center portion of the upper surface of wafer W from first discharging port 11 through first flow line 11a of top plate nozzle 70n. The supplied CDIW fills the space between lower end portion 70E of top plate nozzle 70n and the upper surface of wafer W to rinse the lower surface of lower end portion 70E, and is dispersed to the entire upper surface of wafer W to rinse the upper surface of wafer W. As illustrated in FIG. 10B, lower end portion 70E is rinsed using the liquid film of the CDIW.

At this time, with respect to the pattern surface which is the lower surface of wafer W, the CDIW is supplied from base plate nozzle 60n to wafer W. As a result, the upper/lower surfaces may be rinsed.

Next, as illustrated in FIG. 11, nozzle driving unit 10M moves up top plate nozzle 70n with respect to top plate 70, and thus, lower end portion 70E of top plate nozzle 70n approaches to top plate 70.

In the state, while top plate 70 and wafer W are rotated, the CDIW is supplied laterally toward the lower surface of top plate 70 from second discharging port 12 through second flow line 12a of top plate nozzle 70n. As described above, the CDIW is supplied radially toward the lower surface of top plate 70 from second discharging port 12, and thus, the lower surface of top plate 70 may be effectively cleaned by the CDIW. At this time, the CDIW may drop from top plate 70 to the upper surface of wafer W, and thus, the CDIW is supplied from first discharging port 11 onto the upper surface of wafer W to form a liquid film on wafer W. Even if the liquid drops, the liquid may flow out along with the liquid film.

That is, the SPM used at step S101 and the SC1 used at step S104 may be attached to the lower surface of top plate 70, but these SPM and SC1 may be effectively removed from the lower surface of top plate 70 by supplying the CDIW to the lower surface of top plate 70.

As described above, when the rinse processing is completed, the process proceeds to step S106.

At step S106 in FIG. 2, a processing that dries wafer W while wafer W is rotated is performed.

Specifically, the discharging of the CDIW from top plate nozzle 70n and base plate nozzle 60n is stopped firstly. Next, opening/closing valves 58 and 58A are opened, and thus, an inert gas (N2 gas) is sprayed from top plate nozzle 70n and base plate nozzle 60n. At this time, top plate 70 and wafer W are continuously rotated, the remaining CDIW on the surfaces of wafer W is removed, and thus, the surfaces of wafer W may be dried.

Next, the drying process in top plate nozzle 70n side will be described in detail as below.

As illustrated in FIG. 12, when the N2 gas is supplied from top plate nozzle 70n, top plate nozzle 70n descends in advance by nozzle driving unit 10M with respect to top plate 70, lower end portion 70E of top plate nozzle 70n is spaced from top plate 70.

In this state, opening/closing valve 58A is opened, and as a result, the N2 gas is supplied downward to the center portion of wafer W from first discharging port 11 of top plate nozzle 70n and the N2 gas is supplied laterally toward the upper surface of wafer W from second discharging port 12.

As a result, the remaining CDIW on the upper surface of wafer W is removed.

In this case, since top plate nozzle 70n descends with respect to top plate 70 and approaches to wafer W, the N2 gas supplied from first discharging port 11 of top plate nozzle 70n may also remove the remaining CDIW on lower end portion 70E of top plate nozzle 70n. As a result, top plate nozzle 70n itself is dried by the N2 gas.

As described above, when the dry processing is completed, the process proceeds to step S107.

At step S110 in FIG. 2, wafer W having been processed is carried out to the outside of liquid processing apparatus 100 by the transport mechanism. The method of carrying out is the same as a reverse order of step S101, and thus, the descriptions thereof will be omitted. When the carrying-out is completed, the process proceeds to "END" in FIG. 2, and thus, the operation is completed.

As described above, according to the present exemplary embodiment, top plate 70 may be effectively cleaned during the liquid processing process.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
a cover plate configured to cover a substrate from above;
a cover plate rotating mechanism configured to rotate the cover plate;
a nozzle including a first discharging port provided in the rotational center portion of the cover plate and configured to supply a rinse liquid toward the substrate, and a second discharging port configured to supply a rinse liquid radially toward the cover plate; and
a nozzle driving unit configured to move the nozzle to an ascending position and a descending position with respect to the cover plate,
wherein the nozzle supplies the rinse liquid toward the cover plate from the second discharging port at the ascending position and supplies the rinse liquid toward the substrate from the first discharging port at the descending position, and
the nozzle is a cylindrical body having a lower flange, and the lower flange is provided with the first discharging port and the second discharging port.

2. The liquid processing apparatus of claim 1, wherein the cover plate includes a top-side substrate holder that rotatably holds the substrate in the horizontal direction.

3. The liquid processing apparatus of claim 2, further comprising: a storage member bottom portion provided so as to opposite the lower surface of the substrate held by the top-side substrate holder;
- a storage member bank portion provided in the outer peripheral side of the storage member bottom portion and configured to surround the storage member bottom portion; and
- a driving unit configured to control a spaced distance between the top-side substrate holder and the storage member bottom portion.

4. The liquid processing apparatus of claim 3, further comprising a cup part configured to surround the storage member bank portion,
wherein the cup part includes a first annular liquid receiving portion and a second annular liquid receiving portion provided on an outer peripheral side of the first liquid receiving portion.

5. The liquid processing apparatus of claim 1, further comprising a bottom-side substrate holder that rotatably holds the substrate from below.

6. The liquid processing apparatus of claim 5, further comprising a cup part configured to surround the bottom-side substrate holder,
wherein the cup part includes a first annular liquid receiving portion and a second annular liquid receiving portion provided on an outer peripheral side of the first liquid receiving portion.

7. The liquid processing apparatus of claim 1, wherein the nozzle supplies an inert gas from the first discharging port and the second discharging port.

* * * * *